(12) United States Patent
Dao et al.

(10) Patent No.: US 9,032,121 B2
(45) Date of Patent: May 12, 2015

(54) METHOD OF ANALYZING THE WEAR OF A NON VOLATILE MEMORY EMBEDDED IN A SECURE ELECTRONIC TOKEN

(75) Inventors: Frédéric Dao, Marseilles (FR); Thierry Silvestre, Marseilles (FR); Frédéric Faure, Cassis (FR)

(73) Assignee: Gemalto SA, Meudon (FR)

( * ) Notice: Subject to any disclaimer, the term of this patent is extended or adjusted under 35 U.S.C. 154(b) by 40 days.

(21) Appl. No.: 13/508,454

(22) PCT Filed: Oct. 19, 2010

(86) PCT No.: PCT/EP2010/065679
§ 371 (c)(1),
(2), (4) Date: May 7, 2012

(87) PCT Pub. No.: WO2011/054661
PCT Pub. Date: May 12, 2011

(65) Prior Publication Data
US 2012/0317318 A1  Dec. 13, 2012

(30) Foreign Application Priority Data
Nov. 9, 2009  (EP) .................................... 09306074

(51) Int. Cl.
*G06F 3/00* (2006.01)
*G06F 5/00* (2006.01)
*G11C 16/34* (2006.01)

(52) U.S. Cl.
CPC .......... *G11C 16/349* (2013.01); *G11C 16/3495* (2013.01)

(58) Field of Classification Search
CPC ............................... G06F 12/00; G06F 3/0653
USPC ............................................................ 710/57
See application file for complete search history.

(56) References Cited

U.S. PATENT DOCUMENTS

2007/0260811 A1* 11/2007 Merry et al. .................. 711/103
2008/0195825 A1*  8/2008 Syed et al. .................... 711/161
(Continued)

FOREIGN PATENT DOCUMENTS

| EP | 2 071 467 A1 | 6/2009 |
| WO | WO 2008/093947 A1 | 8/2008 |
| WO | WO 2008093947 A1 * | 8/2008 |

OTHER PUBLICATIONS

International Search Report (PCT/ISA/210) issued on Nov. 23, 2010, by the European Patent Office as the International Searching Authority for International Application No. PCT/EP2010/065679.
(Continued)

*Primary Examiner* — Chun-Kuan Lee
(74) *Attorney, Agent, or Firm* — Buchanan Ingersoll & Rooney PC

(57) ABSTRACT

The invention is a method of analyzing the wear of a non volatile memory embedded in a secure electronic token. A set of events are intended to generate writing and/or erasing operations in said memory. The token comprises a buffer. The method comprises the following steps: each time an event belonging to said set occurs, generating a data which reflects the event and storing said data in the buffer, sending the buffer to a remote machine, analyzing the buffer to determine the wear of the memory.

13 Claims, 2 Drawing Sheets

(56) References Cited

U.S. PATENT DOCUMENTS

2010/0122200 A1    5/2010   Merry, Jr. et al.
2010/0281206 A1    11/2010   Faure

OTHER PUBLICATIONS

Written Opinion (PCT/ISA/237) issued on Nov. 23, 2010, by the European Patent Office as the International Searching Authority for International Application No. PCT/EP2010/065679.

* cited by examiner

METHOD OF ANALYZING THE WEAR OF A NON VOLATILE MEMORY EMBEDDED IN A SECURE ELECTRONIC TOKEN

FIELD OF THE INVENTION

The present invention relates to methods of analyzing the wear of a non volatile memory embedded in a secure electronic token. It relates particularly to methods of auditing the memory wear caused by the usage of the memory.

PRIOR ART

Electronic tokens are portable electronic devices with limited resources. In general, electronic tokens comprise a plurality of memories of different type. For example, they may comprise memory of RAM, ROM, EEPROM or Flash type. Smart cards and particularly Universal Integrated Circuit Cards (UICC) are secure electronic tokens.

There is a need for using secure electronic tokens in the Machine to Machine market, also named as M2M market. M2M market requires hardware/software components able to run in environment conditions covering a large scope and during a long time. Typically, these components may be able to comply with a temperature range from −40° C. up to +125° C., a high level humidity. These components may also comply with a lifespan up to 15 years.

M2M market uses wireless modules which are integrated in systems for providing M2M communicating services. The wireless modules may comprise secure electronic tokens such as SIM cards. The SIM card chip lifespan depends mostly on two factors: the number of erase/write cycles and the data retention time. Silicon manufacturers generally guarantee these two factors for their chips in SIM card usual conditions, for example in the range of 20° C.-25° C.

The number of erase/write cycles supported by a chip and the data retention highly depends on environmental conditions such as temperature.

In addition, the SIM card chip lifespan also depends on the usage of the SIM card. For example, when an application that stresses a specific part of the memory is often activated, the threshold of maximum number of erase/write cycles may be reached quickly. In particular, the stressed memory area may be a counter or a file frequently updated during an application processing.

It is known to implement long life mechanisms in SIM card to extend the lifespan of SIM memory. In particular, wear leveling and memory cell anti-aging mechanisms may be set in order to improve chip usage time. These mechanisms are initialized before or during the personalization stage of the SIM card.

In order to estimate the future lifespan of a secure token, a mission profile may be associated to a token. Such a mission profile is intended to reflect the future use of the non volatile memory of the token. Usually, the mission profile is built by estimating the number of applicative commands which are supposed to be executed by the token. By knowing the number of accesses to the non volatile memory for each kind of applicative commands, it is then possible to compute an estimated lifespan for a token. For example the mission profile may be based on the assumption that three "authenticate" commands, two "select file" commands and four "update file" commands will be executed on a daily basis. The assessment may also be computed on a monthly or yearly basis. The assessment of the token memory lifespan is important since the token issuer may have to commit on a fixed memory lifespan. In particular, all issues related to the memory lifespan may be treated by a contractual guarantee.

However, at the time of the mission profile building, the pieces of information related to the behavior of the applications using the token may be incomplete or insufficient. Moreover, the pieces of information related to the behavior of the applications using the token may be erroneous or false.

As a consequence, there is a need to check the wear of the memory embedded in a secure token. In particular, it is important to be able to check the usage of the memory even if the token has been issued and deployed on the field.

SUMMARY OF THE INVENTION

An object of the invention is to solve the above mentioned technical problems.

The object of the present invention is a method for analyzing the wear of a non volatile memory which is embedded in a secure electronic token. Several events that are intended to generate writing and/or erasing operations in the non volatile memory form a set. The electronic token comprises a buffer. The method comprises the steps of:

a) each time an event belonging to said set occurs, generating a data which reflects said event, and storing said data in the buffer, b) sending the buffer content to a remote machine, c) analyzing the buffer content to determine the wear of the memory.

Advantageously, the data may be generated as a digest of the event that it reflects.

The event may target a physical memory area and/or a logical container stored in said non volatile memory and the generated data may comprise elements which reflect the targeted physical memory area and/or the targeted logical container.

Each event belonging to the set may be an applicative command or an internal treatment.

Advantageously, the step of sending the buffer content to the remote machine may be automatically started when the buffer is full.

In one embodiment, the secure electronic token may comprise UICC features.

Advantageously, the secure electronic token may be intended to be connected to a M2M device.

The data storage in the buffer may be activated by a first command and/or deactivated by a second command.

Another object of the invention is a secure electronic token comprising a non volatile memory and a buffer. A set of events is intended to generate at least one writing and/or one erasing operation in the memory of the token. The secure electronic token comprises a first means capable of checking that an occurring event belongs to said set. The token comprises a second means capable of generating a data reflecting the occurring event. The token comprises a third means capable of storing the data in the buffer. The token comprises a fourth means capable of sending the buffer content to a remote machine.

Advantageously, the secure electronic token may comprise a fifth means capable of detecting that the buffer is full.

The occurring event may target a physical memory area and/or a logical container stored in the memory and the second means may be capable of generating data comprising elements which reflect the targeted physical memory area and/or the targeted logical container.

In one embodiment, the secure electronic token may comprise a sixth means capable of activating and/or deactivating the data storage in the buffer.

The sixth means may automatically activate the data storage when a preset stress is detected in the token.

Advantageously, the secure electronic token may be a UICC or may be a token which comprises SIM features and which is intended to be connected to a M2M device.

Another object of the invention is a device comprising a communication means capable of establishing a wireless channel with a remote machine. The device comprises a communication interface and a secure electronic token as described above. The secure electronic token is connected to the device by means of a welding or in a removable way.

BRIEF DESCRIPTION OF THE DRAWINGS

Other characteristics and advantages of the present invention will emerge more clearly from a reading of the following description of a number of preferred embodiments of the invention with reference to the corresponding accompanying drawings in which.

DETAILED DESCRIPTION OF THE PREFERRED EMBODIMENTS

The invention may apply to any types of secure electronic token able to exchange data with a distant machine by means of a communication channel. In particular, the secure electronic token may be a M2M token connected to a wireless device which provides means for establishing a communication channel between a distant machine and the secure electronic token. In the examples of this specification, the secure electronic token is a M2M SIM card but it could be any other kind of secure electronic token comprising both a non volatile memory and means for exchanging data with a distant machine. The token may also be a UICC card connected to a mobile phone or to a personal computer.

The invention relies on the automatic recording of specific events which occur into the electronic token. These specific events are selected as events which impact on the memory lifespan.

The invention is especially well suited for secure electronic tokens intended to be used in the M2M domain. An advantage of the invention is to allow memory wear analysis without requiring extraction of the M2M token from the M2M device.

An advantage of the invention is to detect abnormal usage of the memory embedded in a token which is deployed on the field. Thanks to the invention, no physical access to the token is required.

An advantage of the invention is to allow comparing the usage of the token memory with its corresponding mission profile.

Another advantage of the invention is to allow building a mission profile for a set of tokens even if no mission profile has been previously defined for these tokens.

Another advantage of the invention is to allow determining the root default when an issue occurs on a token deployed on the field. In particular, the invention provides a way to check if the wear issue comes from the token itself or comes from the use of the token by the deployed infrastructures and applications.

Figure 1:
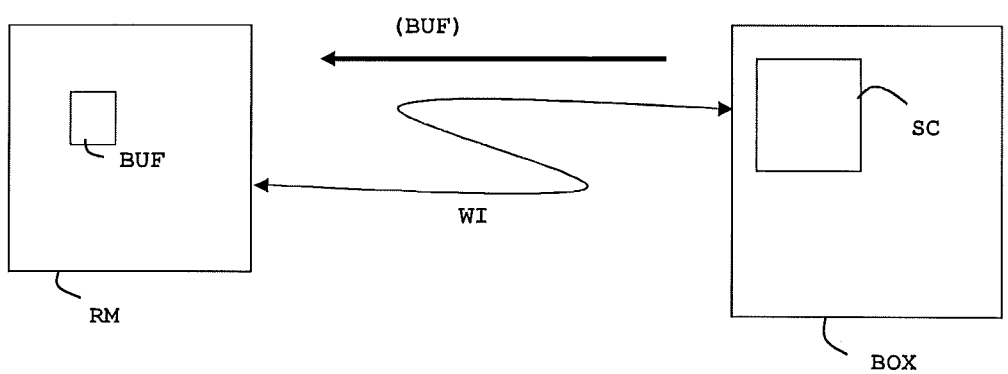
FIG. 1 is an example of a system comprising a remote machine, a wireless device and a secure electronic token according to the invention.

FIG. 1 shows an example of system comprising a distant machine RM, and a wireless device BOX having a secure electronic token SC according to the invention.

The distant machine RM may be a remote server able to exchange data by means of the wireless channel WI. The wireless channel WI may be the Over The Air mechanism—known as OTA—defined by the GSM 03.40, GSM 03.48 and/or ETSI/SCP—3GPP—3GPP2 standards. The wireless device BOX is a M2M device which comprises a secure electronic token SC and a communication interface which allows connecting the token SC. The secure electronic token SC may be a SIM card.

The distant machine RM may belong to the material infrastructure of a mobile network operator (MNO). The material infrastructure is the mobile network of the MNO. This infrastructure allows exchanging data with SIM smart cards on the field.

Alternatively, the distant machine RM may be a server able to exchange data by means of a network channel, in particular through the Internet or any wire links. In such a case the device BOX may have communication means restricted to wire link or may have communication means allowing both wire and wireless links.

The wireless device BOX may be integrated in systems such as an automatic drink distributor or a car, for example.

Alternatively, the connected device BOX may be a mobile phone, a personal computer or any machine allowing establishing a communication channel with the distant machine RM.

According to the invention, a buffer BUF is managed into the token SC. Depending on a specific occurrence, the buffer content is sent to the distant machine RM via the device BOX.

The remote connection between the distant machine RM and the token SC may be the OTA mechanism, using SMS or BIP as a bearer.

Figure 2:
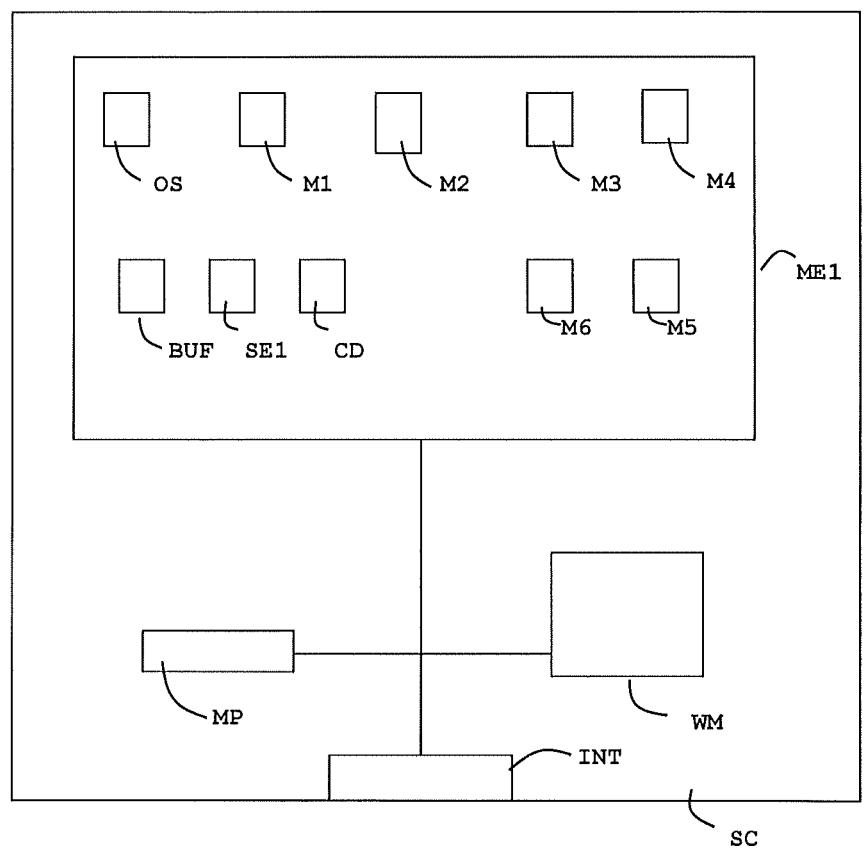
FIG. 2 depicts schematically the architecture of a subscriber identity card of SIM smart card type according to the invention.

FIG. 2 shows an example of architecture of a SIM card as an example of a subscriber identity card according to a preferred embodiment of the invention. The SIM card SC contains a microprocessor MP, a communication interface INT, a non volatile memory ME1, and a working memory WM. The working memory may be a RAM. The communication interface INT is intended to be connected to a device and allows exchanging data with the connected device.

In a preferred embodiment, the connected device is a M2M wireless device.

The memory ME1 may be an EEPROM or a Flash memory. The memory ME1 contains an operating system OS, a buffer BUF, a set SE1 of predefined events, coding rules CD, and six means M1, M2, M3, M4, M5 and M6. In the example of FIG. 2, the memory ME1 is implemented as a unique non volatile memory. The memory ME1 may also be implemented as any combination of several non volatile memories of different types. In particular, the buffer BUF may be stored in a dedicated memory component.

Alternatively, the buffer BUF may be stored in a volatile memory. For example the buffer BUF may be stored in RAM. In this case one must take care of sending the buffer content before it is lost.

The operating system OS may comprise a virtual machine, in particular a Java® virtual machine or a .Net® virtual machine.

The events of set SE1 may be high level commands. For example, the events may be SIM Tool Kit (STK) commands like RunGSMAlgo, Authenticate, UpdateFile, or Envelope.

In the case of a Javacard SIM card, the events of set SE1 may be internal Javacard API invocation like UpdateFile or Transaction according to JAVA Card SIM API GSM 03.19, USIM API for JAVA CARD 3GPP TS 31.130 and UICC API for Java card ETSI TS 102.241.

The events of set SE1 may be low level operations which are internal to the token Operating system. For example, the events may be updating concatenation buffer, updating the Pin ratification counter or updating the Transactional Backup or updating the 03.48 Sequence counter.

Advantageously, the set SE1 of events may be updated by adding/removing/modifying one or several events. This update operation may be carried out through a dedicated command sent by the distant machine RM or any entity having the relevant administrative rights.

The coding rules CD define how events are coded into the buffer BUF. In other words, the coding rules CD define the syntax and the pattern to be used for recording the data that reflect the tracked events.

Advantageously, the data generated according to the coding rules is a digest of the corresponding event. For example, the generated data may contain an extract of the command header and additional element extracted from the command parameters.

The generated data may contain elements related to the physical level of the memory part which is updated by the tracked event. For example, these elements may be a physical address, a memory block, or memory sector.

The generated data may contain elements related to a logical container which is updated by the tracked event. For example, these elements may be a file identifier, a record number of a file, a table identifier, or the length of the data written into a file, etc.

Advantageously, the coding rules CD may be updated by adding/removing/modifying one or several rules. This update operation may be carried out through a dedicated command sent by the distant machine RM or any machine having the relevant administrative rights. This dedicated command may have parameters managed through the Tag-Length-Value mechanism, also named BER-TLV. (See ISO 8825-1 standard).

According to a particular embodiment of the invention, the token has means which can be updated remotely.

When an event occurs on the token SC, the means M1 is able to check that said event belongs to the set SE1.

The means M2 is able to generate a data reflecting an event. The data is generated according to the coding rules CD.

The means M3 is able to store the generated data in the buffer BUF. In a preferred embodiment, the buffer BUF is filled in a sequential manner. Thus the chronological order of the events is kept into the buffer BUF.

The means M4 is able to send the buffer BUF to the remote machine RM.

The means M5 is able to detect that the buffer BUF is full. Alternatively, the means M5 may be able to detect that the amount of data stored in the buffer BUF reaches a preset threshold.

The means M6 is able to activate and/or to deactivate the data storage in the buffer BUF.

The microprocessor MP cooperates with the working memory WM and is intended to run the operating system OS. The six means M1 to M6 may be either software applications run by the microprocessor MP or hardware designed. The six means may be implemented as six distinct elements or merged in one or several elements.

In a preferred embodiment, the six means are implemented as six different software components.

According to the invention, an example of embodiment of the method of analyzing the wear of the memory ME1 comprises several steps.

First a set SE1 of events is built. Each of the events belonging to the set SE1 involves computing executions which are performed into the token SC. These computing executions are supposed to lead to at least one writing operation or one erasing operation into the targeted memory ME1.

The events listed in the set SE1 are also named tracked events. There are two main types of tracked events. The first type of tracked events corresponds to high level events like applicative commands or STK commands. This first level corresponds to commands that are sent to the token by an external machine. For example high level events may be the receipt of an Authenticate command sent by the device, the sending of a SMS command, the Switch ON command, the Switch OFF commands or an Update file request.

The second type of tracked events corresponds to low level events which are trigged by the operating system or a file system manager embedded in the token. For example low level events may be the ratification pin counter updating or the backup of a transactional buffer.

Additionally, a third type of tracked events may be listed in the set SE1. The third type of tracked events may correspond to invocation of the internal virtual machine API when the token comprises a virtual machine. For example third type events may be update file requests, Object creations or Object updates.

In a preferred embodiment, the set SE1 is downloaded into the token SC at personalization stage. Alternatively, the set SE1 may be downloaded into the token SC after the deployment of the token on the field. Moreover, the set SE1 may be created either for a single token or for a plurality of tokens.

By default the tracking of events may be active into the electronic token SC.

Advantageously, a dedicated command may be defined for activating the tracking of events in the token. The tracking of event may be activated if unexpected memory wear is detected. The tracking of event may also be activated for Mission profile verification (i.e. for checking how the connected device and the network use the token). Thus the logging of events in the buffer may be started only if needed on a targeted token.

In one embodiment, a dedicated command may be defined for deactivating the tracking of events in the token. Thus the logging of events in the buffer may be stopped when there is no more need of memory wear analysis. The deactivate command allows to improve the performance of the token when the tracking of events is off since no token resource is used for events tracking.

When the event tracking is active, each time an event occurs into the token SC, the token SC checks if the event belongs to the set SE1. In case of unsuccessful checking, the event is treated by the token without additional operations. In case of successful checking, the token generates a tracking data which reflects the event and stores this tracking data in the buffer BUF. The tracking data is generated from the event. The tracking data is generated according to the coding rules CD.

In a preferred embodiment, each event is associated to a preset tag value. Each event has its own definition. Advantageously, the tag value may comprise a dynamic part.

For example the following tags may be used for high Level events:
 Switch ON Command: "0x01"
 Switch OFF Command: "0x02"
 Authenticate Command: "0x03"
 JAVA Card API UpdateFile EF 7F11: "0x14027F11 0x14 XX Y", where "0x14" stands for the tag Update File, "XX" is the length EF Path and Y is the EF path.

For example the following tag may be used for low level:
Ratification pin counter command: "0x250101 0x25 XX Y", where "0x25" stands for the tag Ratification counter, "XX" is the length counter ID and "Y" is the counter ID.

If several consecutive events which belong to the set SE1 occur into the token, the buffer is updated as many times as there are events.

Then the content of the buffer BUF is sent to a distant server RM. The buffer sending may be automatically started when the buffer BUF is full in the token or when the amount of data stored in the buffer reaches a predefined threshold. For example, the buffer may be sent when the amount of data stored in the buffer is at least equal to 1 000 bytes. This threshold amount may depend on the free space on the token. Advantageously, the threshold amount may be configurable with the activation command or another command. According to another example, the buffer may be sent when the buffer is full at 80%. Alternatively, the buffer sending may be automatically started when the number of events logged into the buffer BUF reaches a preset threshold. For example, the buffer content may be sent when the buffer contains at least 100 or 500 tracking data.

Advantageously, the remote machine RM may request an update of the threshold which is used for managing the buffer sending.

The buffer content may be got by the remote machine RM either in push or pull mode. In other words, the token may make the decision to send the buffer content to the distant server RM or the distant server RM may request the buffer content from the token SC.

In a preferred embodiment, the content of the buffer BUF is analyzed in the distant server RM.

Alternatively, the content of the buffer BUF may be sent from the distant server RM to another machine where the analysis is carried out.

The analysis may be automatically or manually performed. The analysis of the buffer content aims at determining the usage of the memory ME1. The sequence of operations which stress the memory ME1 may be retrieved from the buffer content.

Advantageously, the analysis of the buffer BUF may conclude that the memory ME1 is near its end of life. In such a case, an alert message may be sent to the entity who manages the token. In the case of a M2M token SC, the server RM may notify the M2M customer that the secure token SC shall be replaced. Thus the invention provides a way to know the wearing state of a secure token on the field.

Thanks to the invention, the server may launch a deep analysis of the applications which use the secure token even if a non predictable combination of applicative commands is regularly sent to the token. Generally, the applications which use the secure token are stored in a device connected to the token. This connected device may be a wireless device BOX, a mobile phone or any computer able to exchange command/responses with the token.

Advantageously, the buffer content may be ciphered with a key into the token and deciphered into the server RM. A secret key may be shared by both the token and the server. Alternatively, the token and the server may use a Public key/Private key couple.

Advantageously, the token may comprise an additional means (not drawn at FIG. 2) able to detect an abnormal stress of the token and able to activate the tracking of events on the token. In particular, this additional means may be able to detect an abnormal stress of an area of the memory ME1. For example, the spying of the stress may be based on a dedicated counter reflecting the number of access to a particular part of the memory ME1 or the number of access to a set of logical entities stored in the token. Alternatively, the additional means may be merged with the means M6.

Advantageously, the means M1 may be able to track an updating operation of a preset memory area which is assumed to remain static and unchanged.

Thanks to the invention, the root cause of a token issue may be retrieved. The invention allows detecting a failure coming from any devices/machines involved in the usual running of the token. In particular, the invention allows identifying issues coming from abnormal network interactions, from abnormal behavior of the connected device (e.g. mobile phone or wireless module), from abnormal behavior of the applications (either running in connected device or in the token itself), and from the token chip quality.

The invention claimed is:

1. A method of analyzing the wear of a non-volatile memory embedded in an issued secure electronic token that is deployed to an end user, and which comprises a buffer and Universal Integrated Circuit Card (UICC) features, said method comprising the steps of:
    storing, in said secure electronic token, a set of events for generating at least one of a writing and an erasing operation in said non-volatile memory, said set of events including at least high level events corresponding to commands that are sent to the secure electronic token;
    activating an event tracking in the secure electronic token by an active event tracking mechanism;
    when the event tracking is active, each time an event belonging to said set of events occurs, generating, by the secure electronic token deployed to the end user, a data which reflects said event, and storing said data in the buffer;
    deactivating the event tracking in the secure electronic token by a deactivated event tracking mechanism; and
    sending, by the secure electronic token deployed in the field, said data in the buffer to a remote machine for detailed analysis of the data in the buffer to determine the wear of the memory.

2. A method according to claim 1, wherein the step of sending the data in the buffer to the remote machine is automatically started when the buffer is full.

3. A method according to claim 1, wherein said data is generated as a digest of the event that it reflects and wherein said event belonging to said set is an applicative command or an internal treatment.

4. A method according to claim 1, wherein said event targets a physical memory area and/or a logical container stored in said memory and wherein the data comprises elements reflecting at least one of the targeted physical memory area and the targeted logical container.

5. A method according to claim 1, wherein said secure electronic token is intended to be connected to a Machine to Machine (M2M) device.

6. The method of claim 1, wherein said set of events also includes low level events triggered by at least one of an operating system and a file system manager embedded in the secure electronic token.

7. A secure electronic token comprising a non-volatile memory and a buffer, and which has been issued and is deployed to an end user, said secure electronic token comprising:
    a storage means configured to store a set of events for generating at least one of a writing and an erasing operation in said non-volatile memory, said set of events including at least high level events corresponding to commands that are sent to the secure electronic token;

a means for activating an event tracking in the secure electronic token based on a dedicated event tracking mechanism;

a means for determining whether an occurring event belongs to said set;

a means for generating a data reflecting said occurring event when the event tracking is active;

a means for storing said data in said buffer when the event tracking is active;

a means able to deactivate an event tracking in the secure electronic token based on a dedicated deactivated command; and a means for sending, by the secure electronic token deployed in the field, said data in the buffer to a remote machine for detailed analysis of the data in the buffer to determine the wear of the memory.

8. A secure electronic token according to claim 7, wherein said secure electronic token comprise a means able to detect that the buffer is full.

9. A secure electronic token according to claim 7, wherein said occurring event targets at least one of a physical memory area and a logical container stored in said memory and wherein said means which is able to generate said data is also able to generate data comprising elements reflecting at least one of the targeted physical memory area and the targeted logical container.

10. A secure electronic token according to claim 7, wherein said means to activate automatically activates the event tracking when a preset stress is detected in the token.

11. A secure electronic token according to claim 7, wherein said secure electronic token is a Universal Integrated Circuit Card (UICC) or is a token which comprises SIM features and which is intended to be connected to a Machine to Machine (M2M) device.

12. The secure electronic token of claim 7, wherein said set of events also includes low level events triggered by at least one of an operating system and a file system manager embedded in the secure electronic token.

13. A device, comprising:

a communication means able to establish a wireless channel with a remote machine, a secure electronic token according to claim 7, and, a communication interface, said secure electronic token is connected to said device by means of a welding or in a removable way.

* * * * *